United States Patent
Ieong et al.

(10) Patent No.: US 7,309,626 B2
(45) Date of Patent: Dec. 18, 2007

(54) QUASI SELF-ALIGNED SOURCE/DRAIN FINFET PROCESS

(75) Inventors: Mei-Kei Ieong, Wappingers Falls, NY (US); Thomas Ludwig, Sindelfingen (DE); Edward J. Nowak, Essex Junction, VT (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 11/164,215

(22) Filed: Nov. 15, 2005

(65) Prior Publication Data

US 2007/0108536 A1    May 17, 2007

(51) Int. Cl.
    *H01L 21/00* (2006.01)
    *H01L 21/338* (2006.01)
(52) U.S. Cl. .................. 438/157; 438/149; 438/164; 438/176; 438/283
(58) Field of Classification Search ............... 438/149, 438/157, 164, 176, 283, 479, 515, 517
    See application file for complete search history.

(56) References Cited

U.S. PATENT DOCUMENTS

| | | | |
|---|---|---|---|
| 6,420,231 B1 | 7/2002 | Harari et al. | |
| 6,642,115 B1 | 11/2003 | Cohen et al. | |
| 6,689,650 B2 | 2/2004 | Gambino et al. | |
| 6,803,631 B2 | 10/2004 | Dakshina-Murthy et al. | |
| 6,812,075 B2 | 11/2004 | Fried et al. | |
| 6,951,784 B1 * | 10/2005 | Anderson et al. | 438/157 |
| 7,115,945 B2 * | 10/2006 | Lee et al. | 257/329 |
| 7,244,640 B2 * | 7/2007 | Yang et al. | 438/157 |
| 2004/0092060 A1 | 5/2004 | Gambino et al. | |
| 2004/0150029 A1 | 8/2004 | Lee | |
| 2004/0203211 A1 | 10/2004 | Yang et al. | |
| 2004/0256647 A1 | 12/2004 | Lee et al. | |

* cited by examiner

*Primary Examiner*—Hung Vu
(74) *Attorney, Agent, or Firm*—Scully, Scott, Murphy & Presser, P.C.; William D. Sabo, Esq.

(57) ABSTRACT

A method of forming a semiconductor structure including a plurality of finFFET devices in which crossing masks are employed in providing a rectangular patterns to define relatively thin Fins along with a chemical oxide removal (COR) process is provided. The present method further includes a step of merging adjacent Fins by the use of a selective silicon-containing material. The present invention also relates to the resultant semiconductor structure that is formed utilizing the method of the present invention.

11 Claims, 5 Drawing Sheets

QUASI SELF-ALIGNED SOURCE/DRAIN FINFET PROCESS

FIELD OF THE INVENTION

The present invention relates to semiconductor device processing, and more particularly to a method of forming a semiconductor structure that includes at least multiple FinFET devices in which a single mask is used in defining the Fins, which avoids rounding of the corners where the Fins join the source/drain regions. The term "Fin" is used throughout this application to denote an elevated portion of a semiconducting layer of a semiconductor substrate that includes at least the device channel in which the width thereof is less than its height. The present invention is also related to the semiconductor structure including the multiple FinFET devices that is fabricated using the inventive method.

BACKGROUND OF THE INVENTION

The dimensions of semiconductor field effect transistors (FETs) have been steadily shrinking over the last thirty 30 years or so, as scaling to smaller dimensions leads to continuing device performance improvements. Planar FET devices have a conducting gate electrode positioned above a semiconducting channel, and electrically isolated from the channel by a thin layer of gate oxide. Current through the channel is controlled by applying voltage to the conducting gate.

For a given device length, the amount of current drive for an FET is defined by the device width (w). Current drive scales proportionally to device width, with wider devices carrying more current than narrower devices. Different parts of integrated circuits (ICs) require the FETs to drive different amounts of current, i.e., with different device widths, which is particularly easy to accommodate in planar FET devices by merely changing the device gate width (via lithography).

With conventional planar FET scaling reaching fundamental limits, the semiconductor industry is looking at more unconventional geometries that will facilitate continued device performance improvements. One such class of devices is a FinFET.

A FinFET is a double gate FET in which the device channel is within a semiconducting "Fin" having a width w and height h, where typically w<h. The gate dielectric and gate are positioned around the Fin such that charge flows down the channel on the two sides of the Fin and optionally along the top surface.

FinFET devices typically include a fully depleted body in the Fin that provides several advantages over a conventional FET. These advantages include, for example, nearly ideal turn off in the sub-threshold regime, giving lower off-currents and/or allowing lower threshold voltages, no loss to drain currents from body effects, no 'floating' body effects (often associated with some silicon-on-insulator (SOI) FETs), higher current density, lower voltage operation, and reduced short channel degradation of threshold voltage and off current. Furthermore, FinFETs are more easily scaled to smaller physical dimensions and lower operating voltages than conventional FETs and SOI FETs.

Definition of both the semiconducting Fins and the source/drain regions by a single mask has been extremely difficult in the prior art due to rounding of the corners where the Fins join the wide source/drain areas. As a result, there is neither room for alignment of the gate to the active semiconducting material, nor room for extension implants into the sidewalls of the Fins.

A mask to separately pattern source and drain regions of silicon to link the Fins provides a solution for the rounding problem, but adds an extra overlay for added mask to the Fins, leaving little room for extension implants between the source and drain linking regions and the gate electrode, unless the registration of the various masks is nearly perfect.

In view of the above, there is a need for providing a method that can define both the Fins and the source/drain regions by a single mask that avoids the rounding problem mentioned above as well as the need for using additional overlays.

SUMMARY OF THE INVENTION

The present invention provides a method that overcomes the above mentioned problems using simple rectangular shapes to define the Fins which avoid rounding and yet joins the Fins by a deposition of a selective silicon-containing material post gate etch. More specifically, the present invention provides a method of forming a semiconductor structure including a plurality of FinFET devices in which crossing masks are employed in providing linear patterns to define relatively thin Fins along with a chemical oxide removal (COR) process. The present method further includes a step of merging adjacent Fins by the use of a selective silicon-containing material.

In general terms, the present invention provides a method that includes the steps of:

providing a structure including a plurality of patterned material stacks comprising a nitride layer on top of an oxide hardmask on a surface of semiconductor substrate and a plurality of patterned photomasks which cross over said plurality of patterned material stacks;

performing a chemical oxide removal step that laterally etches at least exposes sidewalls of said oxide hardmask of each material stack not protected by one of said patterned photomasks;

removing the plurality of patterned photomasks to expose patterned material stacks including a laterally etched oxide hardmask beneath said nitride layer;

performing an anisotropic etching process selective to the laterally etched oxide hardmask to remove said nitride layer and at least an upper portion of any semiconducting material of said semiconductor substrate not protected by said laterally etched oxide hardmask to form Fins; and forming a plurality of gate regions that cross over said Fins.

Optionally, the laterally etched oxide hardmask is removed by exposing upper portions of the semiconducting material of the semiconductor substrate previously protected by said laterally etched oxide hardmask, wherein portions of said exposed upper portions of the semiconducting material of the semiconductor substrate previously protected by said laterally etched oxide hardmask define the Fins.

Each of the Fins produced by the inventive method are then merged by forming a Si-containing material between each of the Fins. The Si-containing material prevents rounding of corners of each Fin with their corresponding source/drain region. The source/drain regions are located within wider end portions of each Fin that where previously protected by said plurality of patterned masks that cross over said plurality of patterned stacks. The wider end portions of each Fin are substantially square; i.e., little or no rounding of the corners of the wider end portions occurs in the present invention.

The present invention also relates to the semiconductor structure that is fabricated using the above processing steps. In general terms, the semiconductor structure of the present invention comprises:

a plurality of FinFET devices located on a surface of a semiconductor substrate, each of said FinFET devices including an elevated semiconducting layer that has wider end portions relative to its middle portion, a gate region that crosses said middle portion, and source/drain regions within said wider end portions; and a Si-containing material located between said elevated semiconducting layer that joins each elevated semiconducting layer.

DETAILED DESCRIPTION OF THE INVENTION

The present invention, which provides a method of fabricating a semiconductor structure that includes at least multiple FinFET devices in which a single mask is used in defining the Fins as well as the resultant semiconductor structure, will now be described in greater detail by referring to the following discussion and drawings that accompany the present application. It is noted that the drawings of the present application are provided for illustrative purposes and, as such, they are not drawn to scale.

Reference will be made to FIGS. 1-8 which illustrate an embodiment in which a semiconductor-on-insulator (SOI) substrate is used. Although an SOI substrate is depicted and described in the following discussion, the present invention also contemplates utilizing a bulk semiconductor substrate. When a bulk semiconductor substrate is used, the bulk semiconductor substrate comprises one of Si, Ge alloys, SiGe, GaAs, InAs, InP, SiCGe, SiC as well as other III/V or II/VI compound semiconductors. Preferably, and when a bulk semiconductor is employed, the substrate includes a Si-containing semiconducting material, with Si being highly preferred.

As indicated above, the processing description provided herein utilizes an SOI substrate. An SOI substrate includes a bottom semiconductor layer and a top semiconductor layer (i.e., active semiconductor layer) that are electrically isolated from each other by a buried insulating layer. The top and bottom semiconductor layers may comprise one of the above mentioned bulk semiconductor materials, with Si-containing semiconductors, preferably, Si being highly preferred. The buried insulating material separating the two semiconducting layers may be a crystalline or non-crystalline oxide or nitride, with crystalline oxides being highly preferred. It is noted that SOI substrates are preferred over bulk substrates since they permit formation of devices having higher operating speeds. In particular, devices formed using SOI technology provide higher performance, absence of latch-up, higher packaging density and low voltage applications as compared with their bulk semiconductor counterparts.

The SOI substrate employed in the present invention may be formed utilizing conventional processing techniques well known in the art. For example, a layer transfer process including a bonding step can be used in providing the SOI substrate. Alternatively, an implantation process such as SIMOX (Separation by IMplantation of OXygen) can be used in forming the SOI substrate.

The thickness of the various layers of the SOI substrate may vary depending on the technique used in forming the same. Typically, however, the top semiconductor layer has a thickness from about 3 to about 100 nm, the buried insulating layer has a thickness from about 10 to about 150 nm, and the thickness of the bottom semiconductor layer of the SOI substrate is inconsequential to the present invention.

Figure 1A:
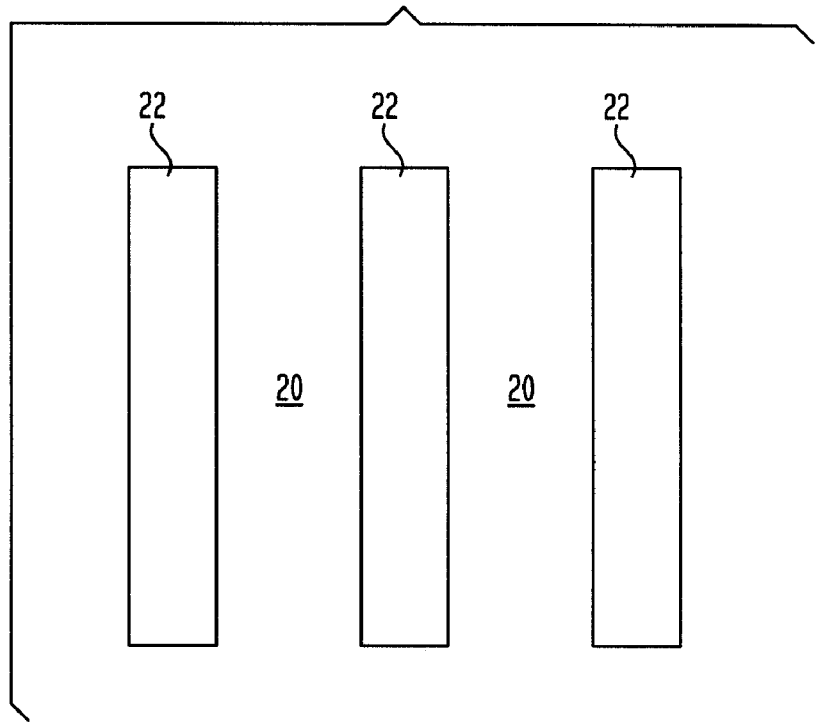
FIG. 1A is a pictorial representation (through a top-down view) and FIG. 1B is a pictorial representation (through a cross-sectional view) showing a plurality of first patterned photomasks located over a structure including (from bottom to top) a semiconductor substrate, an oxide hardmask and a nitride layer.
Figure 1B:
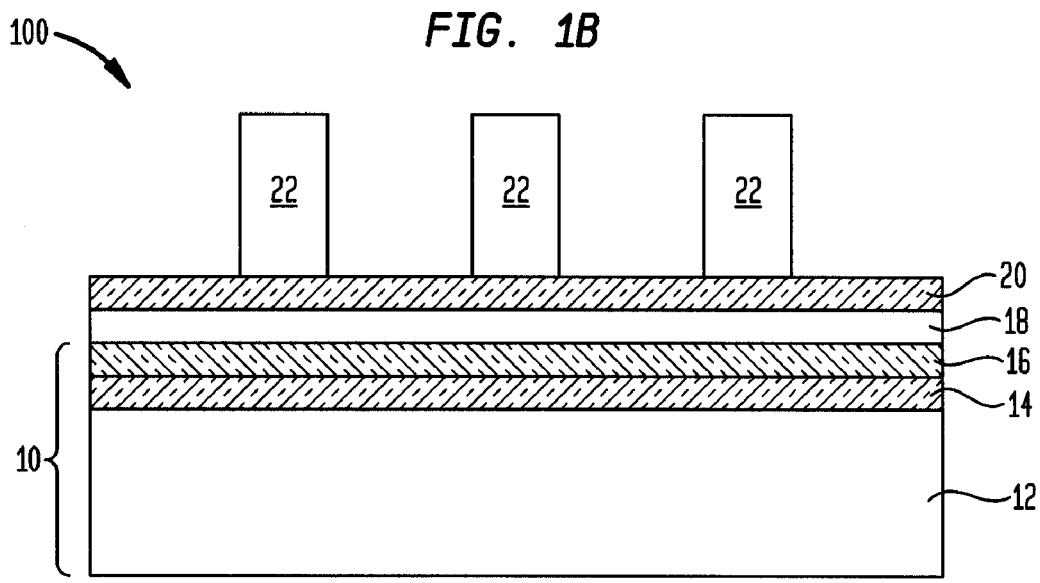

Reference is now made to FIG. 1B which is a pictorial representation (through a cross-sectional view) showing a plurality of first patterned photomasks 22 located over a structure 100 including (from bottom to top) an SOI semiconductor substrate 10, an oxide hardmask 18 and a nitride layer 20. As stated above, the SOI substrate 10 includes a bottom semiconductor layer 12, a buried insulating layer 14 and a top semiconductor layer 16. A top-down view of structure 100 is shown in FIG. 1A. In the top-down views provided in the present application, only the patterned regions are highlighted.

The structure 100 is formed by first providing an SOI substrate (or bulk semiconductor substrate) by conventional techniques. Next, the oxide hardmask 18 is formed on the upper surface of the substrate, e.g., the upper surface of the top semiconductor layer 16, utilizing a conventional deposition process such as, for example, chemical vapor deposition (CVD), plasma enhanced chemical vapor deposition (PECVD), atomic layer deposition (ALD), physical vapor deposition (PVD), evaporation, chemical solution deposition and other like deposition processes. Alternatively, the oxide hardmask 18 is formed utilizing a conventional oxidation process. The thickness of the oxide hardmask 18 formed at this point of the present invention may vary depending on the technique that was used in forming the same. Typically, the thickness of the oxide hardmask 18 employed in the present invention is from about 1 to about 50 nm, with a thickness from about 2 to about 30 nm being even more typical.

Following the formation of the oxide hardmask 18, a nitride layer 20 such as $Si_3N_4$ is formed atop the oxide hardmask 18. The nitride layer 20 can be formed utilizing a conventional deposition process such as CVD, PECVD, ALD, PVD, evaporation, chemical solution deposition or and other like deposition processes. Alternatively, the nitride layer 20 is formed utilizing a conventional nitridation process. The thickness of the nitride layer 20 formed at this point of the present invention may vary depending on the technique that was used in forming the same. Typically, the thickness of the nitride layer 20 employed in the present invention is from about 1 to about 20 nm, with a thickness from about 1.5 to about 4 nm being even more typical.

After nitride layer 20 formation, a blanket layer of photoresist material is deposited on the surface of the nitride layer 20 utilizing a conventional deposition process such as, for example, CVD, PECVD, evaporation or spin-on coating. The blanket layer of photoresist material is patterned into a plurality of first patterned photomasks 22 as shown in FIGS. 1A and 1B. Patterning of the photoresist material is achieved by utilizing a conventional lithographic process which includes exposing the photoresist material to a pattern of radiation and developing the exposed photoresist material utilizing a conventional resist developer.

To better highlight the inventive method, the fabrication process will make reference to top-down views from now on. With the plurality of first patterned photomasks 22 in place, the exposed nitride layer 20 and the underlying oxide hardmask 18 are removed from the structure 100 utilizing one or more etching processes. The one or more etching processes remove the unprotected portions of layers 20 and 18, stopping on an upper surface of the SOI substrate 10, i.e., atop the top semiconductor layer 16. The one or more etching processes may include dry etching or wet etching. Preferably, dry etching such as reactive-ion etching (RIE) is used. Other examples of dry etching that can be used at this point of the present invention include ion beam etching, plasma etching or laser ablation.

After the one or more etching processes have been performed, the plurality of first patterned photomasks 22 are removed utilizing a conventional resist stripping process. The structure at this point of the present invention includes a plurality of material stacks 24 containing remaining portions of nitride layer 20 and oxide hardmask 18 on the SOI substrate 10.

A plurality of second photomasks 26 is then formed so as to cross stripes of material stacks 24. That is, the plurality of second photomasks 26 is formed such that each of the second photomasks 26 lay across the material stacks 24. The plurality of second photomasks 26 are formed by first applying a second blanket photoresist material to the structure shown in FIGS. 1A and 1B and then subjecting that blanket photoresist layer to lithography. The area between the second photomasks 26, particularly the underlying top semiconductor layer 16 of the SOI substrate 10, represents the location wherein the Fins of each FinFET device will be formed.

Figure 2:
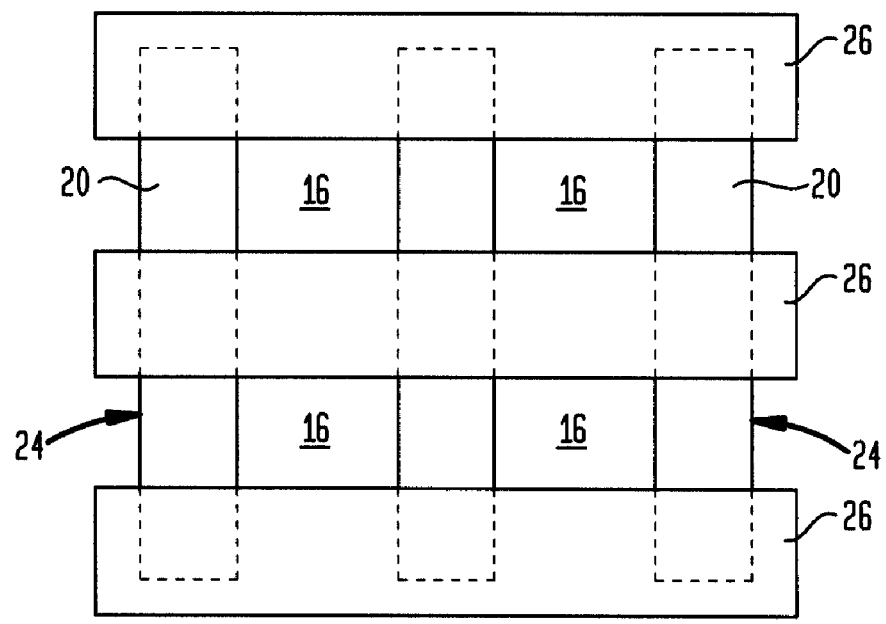
FIG. 2 is a pictorial representation (through a top-down view) showing the structure of FIG. 1 after etching exposed regions of the nitride layer and the oxide layer stopping on an upper surface of the semiconductor substrate, removing the plurality of first patterned photomasks and forming a plurality of second patterned photomasks that lay across stripes of stacked oxide/nitride layers.

The structure including the plurality of second photomasks 26 and the material stacks 24 is shown in FIG. 2. Note, that the plurality of second photomasks 26 protect some portions of the material stacks 24 as well as the adjacent SOI substrate 10, e.g., the top semiconductor layer 18.

Figure 3:
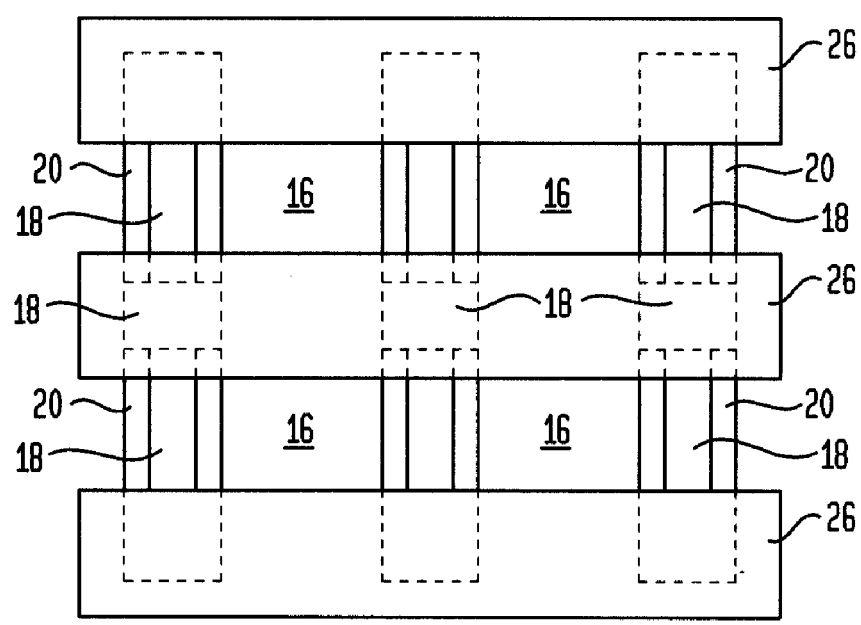
FIG. 3 is a pictorial representation (through a top-down view) showing the structure of FIG. 2 after performing a chemical oxide removal (COR) process which etches exposed sidewalls of the oxide hardmask to a desired distance undercutting both the nitride layer and the second patterned photoresist masks by the distance.

The resultant structure shown in FIG. 2 is then subjected to a chemical oxide removal (COR) process. The COR process selectively etches (in a lateral direction) exposed vertical surfaces of the oxide hardmask 18 of each material stack 24 undercutting both the overlying nitride layer 20 and each of the second photomasks 26. The lateral etch is performed to a predetermined distance of from about 5 to about 40 nm, which distance is substantially the same for the undercuts as well. FIG. 3 shows the structure after the COR process. Note that in FIG. 3 and FIG. 4 the pattern formed in the underlying oxide hardmask 18 is shown to emphasize the COR processing step of the present invention. Although the patterned oxide hardmask 18 is shown in these drawings of the present invention, nitride layer 20 remains atop the patterned hardmask 18 at these two stages of the present invention.

The COR process used in providing the structure shown in FIG. 3 comprises exposing the structure of FIG. 2 to a gaseous or vaporous mixture of HF and ammonia at a pressure of about 30 mTorr or below, preferably at a pressure from about 1 mTorr to about 30 mTorr. The COR process is typically performed at a temperature that is about nominal room temperature (20° C. to about 40° C.), with a temperature of about 25° C. being even more typical. The ratio of HF to ammonia employed in the COR process is typically from about 1:10 to about 10:1, with a ratio of about 2:1 being even more typical.

Figure 4:
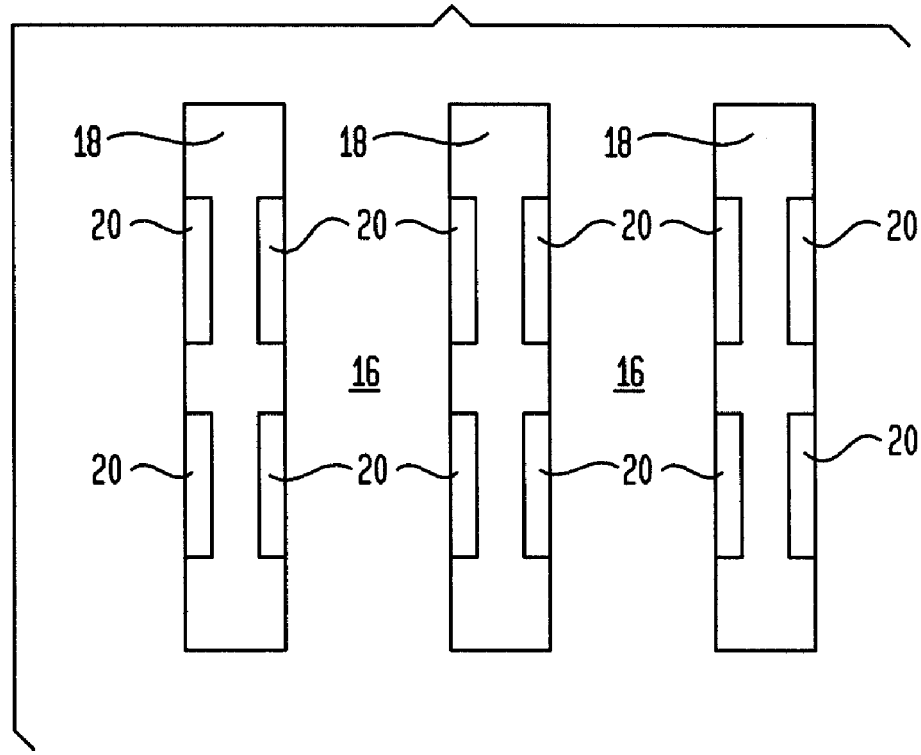
FIG. 4 is a pictorial representation (through a top-down view) showing the structure of FIG. 3 after removing the second patterned photoresist masks; an undercut oxide layer pattern is illustrated, although cover by the nitride layer.

After performing the COR process, the plurality of second photomasks 26 are removed from the structure utilizing a conventional resist stripping processing step. FIG. 4 shows the resultant structure that is formed after the plurality of second photomasks 26 are removed from the structure. In this drawing, the undercut oxide layer 18 is again illustrated, although covered by nitride layer 20.

Figure 5:
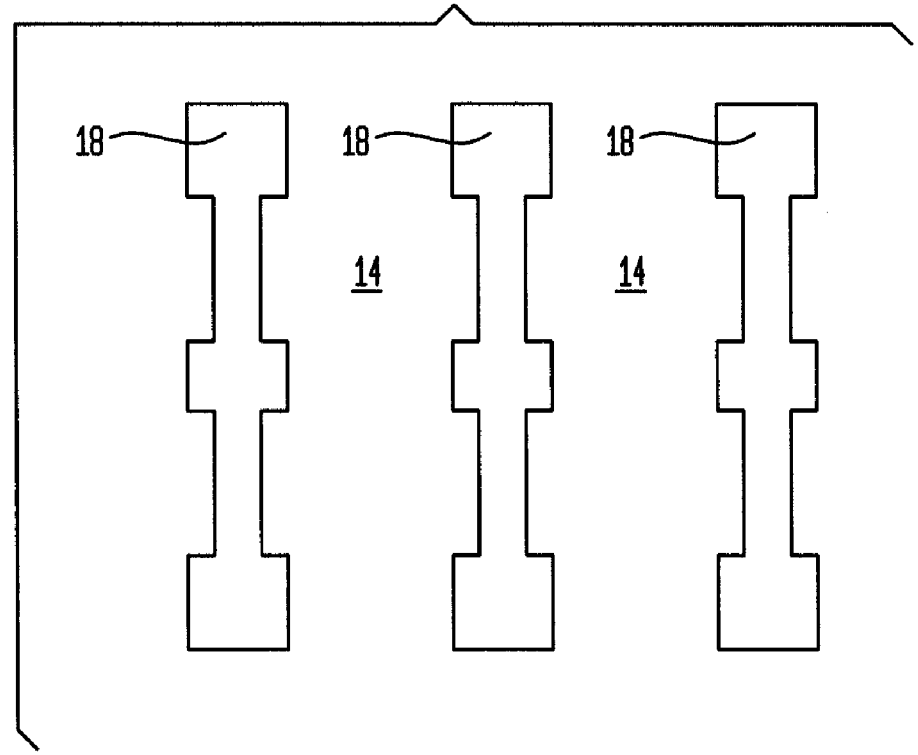
FIG. 5 is a pictorial representation (through a top-down view) showing the structure of FIG. 4 after performing an anisotropic etch that is selective to the oxide layer, stopping within the semiconductor substrate, e.g., on a buried insulator layer within the substrate.

An anisotropic Si etch, selective to the remaining oxide hardmask 18, is used to remove the remaining nitride layer 20 as well as exposed top semiconductor layer 16 of SOI substrate 10, stopping on buried insulating layer 14. When a bulk substrate is used, this etch thins the substrate to a predetermined value. An example of an anisotropic Si etch that can be used at this point of the present invention includes reactive-ion etching with a fluorocarbon chemistry, such as $CF_4$. The resultant structure is shown, for example, in FIG. 5. In FIG. 5, oxide hardmask 18 remains, and buried insulating layer 14 is exposed. It is emphasized that the top semiconductor layer 16 underlying the patterned oxide hardmask 18 will now have the same pattern as layer 18.

The remaining oxide hardmask 18 can be removed in one embodiment, in which case the top surface of the Fin will become part of the FinFET channel once the structure is complete. Specifically, an etching process selective to the semiconducting material can be used to optionally remove the remaining oxide hardmask 18. In the drawings, the remaining oxide hardmask 18 is shown as being removed from the structure. Although this is illustrated, the present invention also contemplates embodiments where the remaining oxide hardmask 18 remains in the structure during the following processing steps.

In some embodiments of the present invention, the patterned semiconductor layer 16 may need to be ion implanted at this point of the present invention. When ion implantation is needed, a conventional ion implantation process can be used to implant dopant ions (p- or n-type) into the patterned top semiconducting layer 16.

Figure 6:
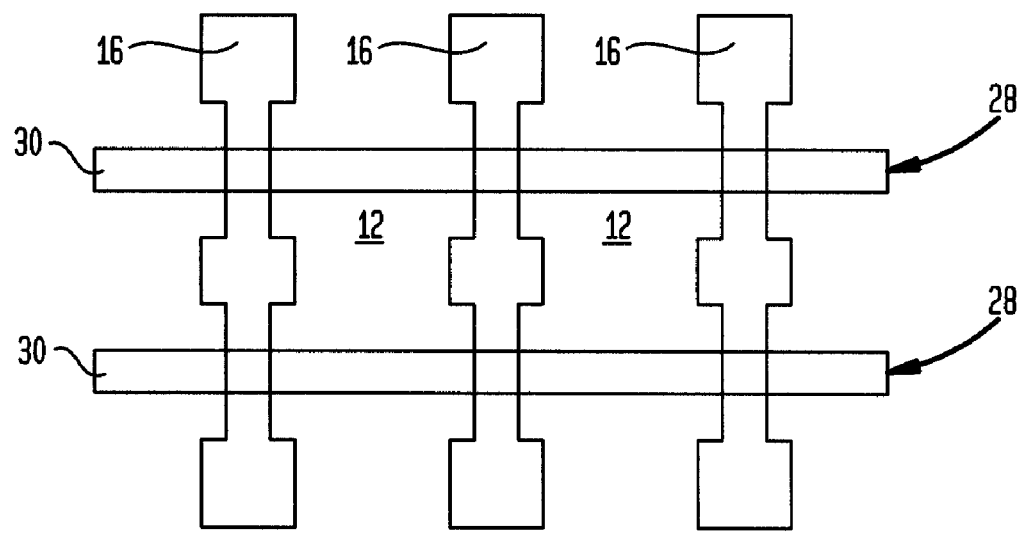
FIG. 6 is a pictorial representation (through a top-down view) showing the structure of FIG. 5 after forming a gate region including a gate dielectric and a gate electrode.

FIG. 6 shows the structure of FIG. 5 forming a gate region 28 that includes a gate dielectric (not shown in this drawing of the present invention) and an overlying gate electrode 30. The gate dielectric is formed first, followed by the gate electrode. Specifically, the gate dielectric is formed by first providing a sacrificial oxide (not shown) on the structure and then stripping the sacrificial oxide to remove imperfections in the structure. The gate dielectric is then formed by a thermal growth process such as, for example, oxidation, nitridation or oxynitridation. Alternatively, the gate dielectric can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric may also be formed utilizing any combination of the above processes.

The gate dielectric is comprised of an insulating material having a dielectric constant of about 4.0 or greater, preferably greater than 7.0. The dielectric constants mentioned herein are relative to a vacuum. Note that $SiO_2$ typically has a dielectric constant that is about 4.0. Specifically, the gate dielectric employed in the present invention includes, but is not limited to: an oxide, nitride, oxynitride and/or silicates including metal silicates, aluminates, titanates and nitrides. In one embodiment, it is preferred that the gate dielectric is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof.

The physical thickness of the gate dielectric may vary, but typically, the gate dielectric has a thickness from about 1 to about 10 nm, with a thickness from about 1 to about 3 nm being more typical.

After forming the gate dielectric, a blanket layer of a conductive material which forms the gate electrode 30 of gate region 28 is formed on the gate dielectric utilizing a known deposition process such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to: Al, W, Cu, Ti or other like conductive metals. The blanket layer of conductive material may be doped or undoped. If doped, an in-situ doping deposition process may be employed. Alternatively, a doped conductive material can be formed by deposition, ion implantation and annealing.

The doping of the conductive material will shift the workfunction of the gate formed. Illustrative examples of doping ions include As, P, B, Sb, Bi, In, Al, TI, Ga or mixtures thereof. The thickness, i.e., height, of the conductive material deposited at this point of the present invention may vary depending on the deposition process employed. Typically, the conductive material has a vertical thickness from about 20 to about 180 nm, with a thickness from about 40 to about 150 nm being more typical.

In some embodiments, an optional hardmask (not shown) may be formed atop the conductive material utilizing a conventional deposition process. The optional hardmask can be comprised of a dielectric such as an oxide or nitride.

Figure 7:
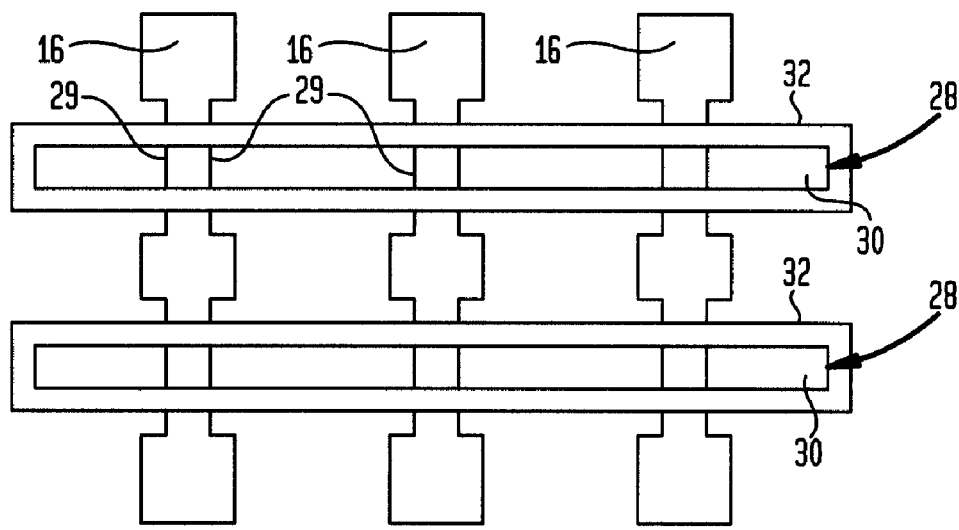
FIG. 7 is a pictorial representation (through a top-down view) showing the structure of FIG. 6 after spacer formation.
Figure 8:
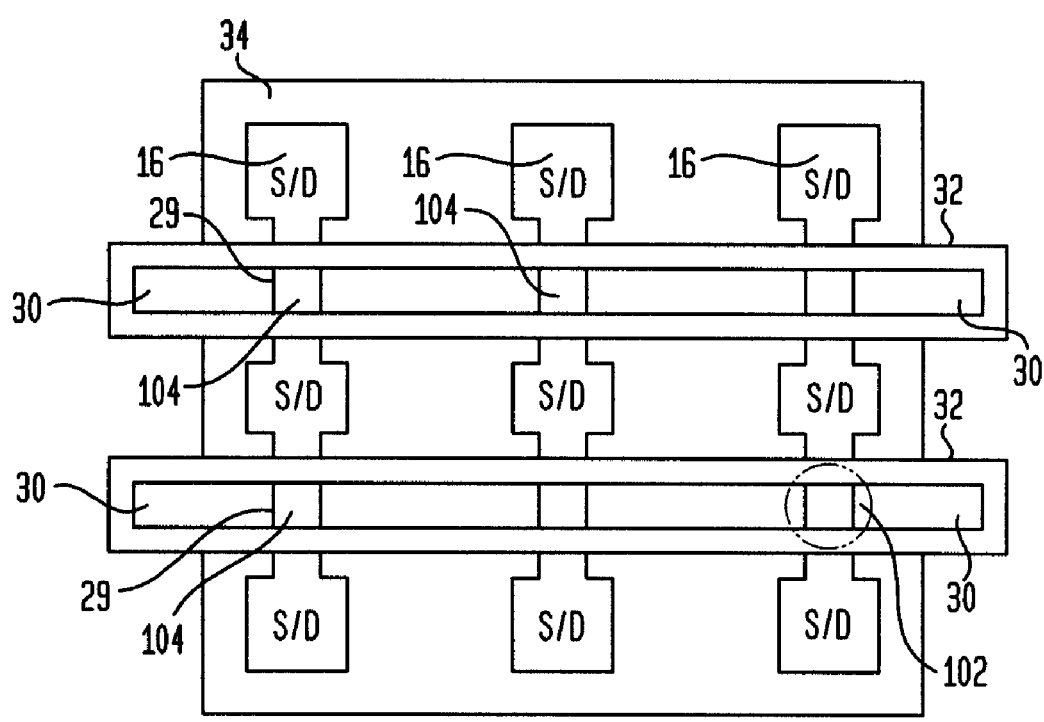
FIG. 8 is a pictorial representation (through a top-down view) showing the structure of FIG. 7 after selectively forming a Si-containing layer on exposed sidewalls of the substrate.

After deposition of at least the gate dielectric and the conductive material, gate regions 28 including gate electrode 30 are formed. Specifically, the gate regions 28 are formed by first providing a patterned mask atop the conductive material by deposition and lithography and then transferring the pattern to the conductive material and optional the gate dielectric. The etching steps comprise one or more etching processes including dry etching such as RIE. It is noted that the region of patterned semiconductor 16 in which the gates cross over is the channel region of the Fin. The Fin is an elevated semiconductor layer 16 that includes wider end portions connected by a thinner middle portion as is shown in FIGS. 6-8. It is observed that the patterned semiconductor layer 16 has a dumb bell or dog bone shape in which the outer, wider end portions are substantially square due to the processing steps of the present invention.

Next, source/drain extension regions (not shown) and/or halo regions (not shown) are formed into the semiconductor substrate utilizing conventional implantation processes well known to those skilled in the art.

Next, a gate spacer 32 comprising an oxide, nitride, oxynitride or combination thereof is formed around the perimeter of the gate region 28 as is shown, for example, in FIG. 7. The gate spacer 32 is formed by a conventional deposition process such as, for example, CVD or PECVD, followed by a directional etching process. It is noted that the gate dielectric is shown in this drawing and FIG. 8 to illustrate its position relative to the channel portion of the Fin; reference numeral 29 denotes the gate dielectric surrounding the channel position of the Fin.

Next, and as shown in FIG. 8, a single crystalline Si-containing material 34 such as Si, SiGe or SiGeC is selectively grown from the exposed sidewalls of the top semiconductor layer 16 of the SOI substrate 10. The single crystalline Si-containing material 34 is formed by CVD, PECVD or an UHVCV process. Source/drain regions (the term 'S/D' is used in FIG. 8 to represent the location of the source/drain regions) are then implanted into wider portion of the semiconductor material 16 adjoining each Fin utilizing conventional ion implantation techniques well known in the art.

The above processing steps provide a semiconductor structure such as shown in FIG. 8 that includes at least multiple FinFET devices 102 in which a single mask is used in defining the Fins 104 which avoids rounding of the corners where the Fins 104 join the source/drain regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    providing a structure including a plurality of patterned material stacks comprising a nitride layer on top of an oxide hardmask on a surface of semiconductor substrate and a plurality of patterned photomasks which cross over said plurality of patterned material stacks;
    performing a chemical oxide removal step that laterally etches at least exposes sidewalls of said oxide hardmask of each material stack not protected by one of said patterned photomasks;
    removing the plurality of patterned photomasks to expose patterned material stacks including a laterally etched oxide hardmask beneath said nitride layer;
    performing an anisotropic etching process selective to the laterally etched oxide hardmask to remove said nitride layer and at least an upper portion of any semiconducting material of said semiconductor substrate not protected by said laterally etched oxide hardmask thereby forming Fins; and forming a plurality of gate regions that cross over said Fins.

2. The method of claim 1 further comprising forming a Si-containing material between each of said Fins so as to join adjoining Fins.

3. The method of claim 2 wherein said Si-containing material comprises one of single crystalline Si, SiGe or SiGeC.

4. The method of claim 1 wherein said semiconductor substrate is an SOI or bulk semiconductor.

5. The method of claim 1 wherein said chemical oxide removal step comprises utilizing a gaseous or vaporous mixture of HF and ammonia, wherein the ratio of HF to ammonia is from about 1:10 to about 10:1.

6. The method of claim 1 further comprising removing said laterally etched oxide hardmask exposing upper portions of the semiconducting material of the semiconductor substrate previously protected by said laterally etched oxide hardmask.

7. The method of claim 1 wherein each Fin has wider end portions relative to its middle portion, and said gate regions are formed so as to cross said middle portion, and source/drain regions are formed within said wider end portions.

8. The method of claim 1 further comprising forming source/drain regions within end portions of each Fin, said end portions of each Fin are substantially square.

9. A method of forming a semiconductor structure comprising:

providing a plurality of patterned material stacks comprising a nitride layer on top of an oxide hardmask on a surface of top semiconducting layer of an SOI substrate and a plurality of patterned photomasks which cross over said plurality of patterned material stacks;

performing a chemical oxide removal step which laterally etches at least exposes sidewalls said oxide hardmask of each material stack not protected by one of said patterned photomasks;

removing the plurality of patterned photomasks to expose patterned material stacks including a laterally etched oxide hardmask beneath said nitride layer;

performing an anisotropic etching process selective to the laterally etched oxide hardmask to remove said nitride layer and at least said top semiconducting layer of the SOI substrate not protected by said laterally etched oxide hardmask, stopping on a buried insulating layer of said SOI substrate;

removing said laterally etched oxide hardmask exposing upper portions of the top semiconducting layer of the SOI substrate previously protected by said laterally etched oxide hardmask as well as exposed portions of the buried insulating layer, wherein portions of said exposed top semiconducting layer of the SOI substrate previously protected by said laterally etched oxide hardmask defines Fins; and forming a plurality of gate regions which cross over said Fins.

10. The method of claim 9 further comprising forming a Si-containing material between each of said Fins so as to join adjoining Fins.

11. The method of claim 9 wherein said chemical oxide removal step comprises utilizing a gaseous or vaporous mixture of HF and ammonia, wherein the ratio of HF to ammonia is from about 1:10 to about 10:1.

* * * * *